United States Patent
Al-omari et al.

(10) Patent No.: US 9,057,766 B2
(45) Date of Patent: Jun. 16, 2015

(54) ISOLATING FAILING LATCHES USING A LOGIC BUILT-IN SELF-TEST

(71) Applicant: International Business Machines Corporation, Armonk, NY (US)

(72) Inventors: Ra'ed M. Al-omari, Round Rock, TX (US); Michael W. Harper, Round Rock, TX (US); Cindy Phan, Pflugerville, TX (US); Mack W. Riley, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 187 days.

(21) Appl. No.: 13/689,044

(22) Filed: Nov. 29, 2012

(65) Prior Publication Data

US 2014/0149814 A1 May 29, 2014

(51) Int. Cl.
*G01R 31/28* (2006.01)
*G01R 31/3185* (2006.01)
*G01R 31/3187* (2006.01)

(52) U.S. Cl.
CPC .... *G01R 31/318566* (2013.01); *G01R 31/318569* (2013.01); *G01R 31/3187* (2013.01)

(58) Field of Classification Search
CPC ............. G01R 31/3187; G01R 31/318569; G01R 31/318556
USPC .......................................... 714/726, 728, 729
See application file for complete search history.

(56) References Cited

U.S. PATENT DOCUMENTS

| | | | |
|---|---|---|---|
| 6,125,465 A | 9/2000 | McNamara et al. | |
| 6,901,546 B2 | 5/2005 | Chu et al. | |
| 6,961,886 B2 | 11/2005 | Motika et al. | |
| 2003/0149925 A1 | 8/2003 | Angelotti et al. | |
| 2006/0282732 A1* | 12/2006 | Kiryu ............................ | 714/738 |
| 2008/0077833 A1 | 3/2008 | Motika et al. | |
| 2008/0189584 A1* | 8/2008 | Hilgendorf et al. ........... | 714/729 |
| 2009/0228751 A1* | 9/2009 | Gloekler et al. .............. | 714/728 |
| 2009/0254788 A1 | 10/2009 | Cervantes et al. | |
| 2010/0095177 A1 | 4/2010 | Forlenza et al. | |

FOREIGN PATENT DOCUMENTS

WO    WO 2008/118832 A1    10/2008

OTHER PUBLICATIONS

"630+processor-enhanced implementation of logic built-in self-test diagnostic logic capable of detecting and isolating a first fault of scannable latches during tests", IBM Corporation, Research Disclosure RD427086A, Nov. 10, 1999, Abstract only, 2 pages.

Kusko, Mary P. et al., "99% AC test coverage using only LBIST on the 1 GHz IBM S/390 zSeries 900 Microprocessor", International Test Conference, 2001, pp. 586-592.

* cited by examiner

*Primary Examiner* — Sam Rizk
(74) *Attorney, Agent, or Firm* — Francis Lammes; Stephen J. Walder, Jr.; Steven L. Bennett

(57) ABSTRACT

A mechanism is provided for identifying a failing latch within an integrated circuit device. A test sequence is initiated on a set of scan chains associated with an identified failing multiple input signature register. For each test portion in a set of test portions in the test sequence, a comparison is performed between an output of the multiple input signature register and a corresponding value in a set of expected values. Responsive to determining a match, a value of a counter is incremented. Responsive to a failure to match, incrementing of the counter is stopped, and the value of the counter providing an indication of the failing latch in the integrated circuit device is read out.

20 Claims, 4 Drawing Sheets

ISOLATING FAILING LATCHES USING A LOGIC BUILT-IN SELF-TEST

BACKGROUND

The present application relates generally to an improved data processing apparatus and method and more specifically to mechanisms for testing integrated circuits and more specifically to isolating failing latches within an integrated circuit using a logic built-in self-test (LBIST).

Testing of integrated circuit devices is an important factor in ensuring proper functionality of the integrated circuit devices as well as for determining the functional capabilities of the integrated circuit devices for categorization purposes. As integrated circuit devices have become more complex, in an effort to reduce the complexity and cost of the external testing equipment, testing of the integrated circuit devices has moved from the exclusive use of external testing equipment to greater dependence on built-in self-test (BIST) circuitry provided on the integrated circuit device itself. Such BIST circuitry may be used to test the functional logic of the integrated circuit device (LBIST), arrays of the integrated circuit device (ABIST), or the like.

Typically, with LBIST circuitry provided on the integrated circuit device, a test pattern generator generates a test pattern that is applied to the functional logic of the integrated circuit device, or circuit under test (CUT), which in turn outputs a response to a response analyzer that generates a signature based on the analyzed response. With LBIST, all of the logic on the integrated circuit device is tested using a large number of test patterns to ensure high test coverage. The resultant data generated by the logic of the integrated circuit device is captured in "strings" of output latches of the integrated circuit device. After all of the scheduled tests have been completed, the final result is compared to a final result generated by a simulation or an integrated circuit device that is known to operate properly. Based upon this comparison, the integrated circuit device under test may be identified as working properly or incorrectly. However, current LBIST circuitry only identifies whether the entire integrated circuit device under test is defective or not.

SUMMARY

In one illustrative embodiment, a method, in an integrated circuit device, is provided for identifying a failing latch within the integrated circuit device. The illustrative embodiment loads a set of expected values for a set of scan chains associated with an identified failing multiple input signature register into a data structure. The illustrative embodiment initializes a counter to an initial value. The illustrative embodiment initiates a test sequence on the set of scan chains associated with the identified failing multiple input signature register. In the illustrative embodiment, the test sequence comprises a set of test portions. For each of the set of test portions, the illustrative embodiment compares an output of the multiple input signature register to a corresponding value in the set of expected values. Responsive to determining a match between the output of the multiple input signature register to the corresponding value in the set of expected values, the illustrative embodiment increments the counter. Responsive to determining that the output of the multiple input signature register does not match the corresponding value in the set of expected values, the illustrative embodiment stops the increment of the latch counter and reads out the value of the counter to identify the failing latch in the integrated circuit device.

In other illustrative embodiments, an integrated circuit device comprising a logic built-in self-test device for identifying a failing latch within the integrated circuit device is provided. The logic built-in self-test device performs various ones of, and combinations of, the operations outlined above with regard to the method illustrative embodiment.

In yet another illustrative embodiment, a data processing system comprising an integrated circuit device that further comprises a logic built-in self-test device for identifying a failing latch within the integrated circuit device is provided. The logic built-in self-test device performs various ones of, and combinations of, the operations outlined above with regard to the method illustrative embodiment.

These and other features and advantages of the present invention will be described in, or will become apparent to those of ordinary skill in the art in view of, the following detailed description of the example embodiments of the present invention.

BRIEF DESCRIPTION OF THE SEVERAL VIEWS OF THE DRAWINGS

The invention, as well as a preferred mode of use and further objectives and advantages thereof, will best be understood by reference to the following detailed description of illustrative embodiments when read in conjunction with the accompanying drawings, wherein.

DETAILED DESCRIPTION

The illustrative embodiments provide mechanisms that, in addition to identifying a defective integrated circuit device, also pinpoint or isolate a failing component within the integrated circuit device utilizing an enhanced logic built-in self-test (LBIST). That is, in previous LBIST implementations, the LBIST comprised no mechanism to identify whether a defect was a real physical failure of a component of the integrated circuit device or if the defect was a side effect from another failing component within the integrated circuit device. This is due to the fact that functional phases of current LBISTs corrupt data, which is then propagated through the functional logic to subsequent components.

Figure 1:
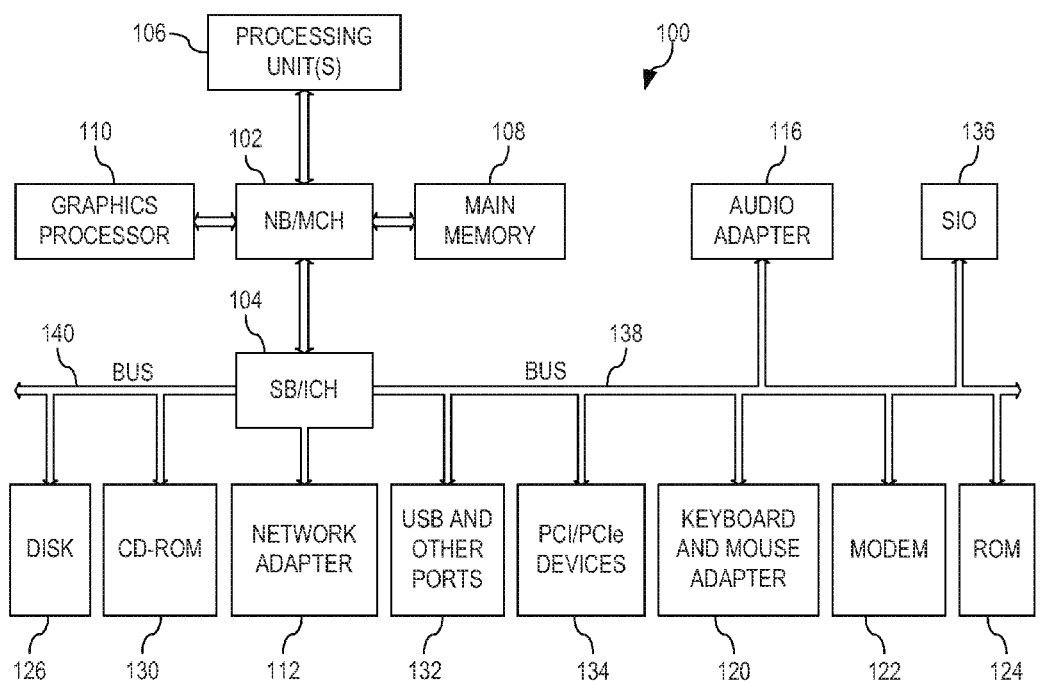
FIG. 1 is an example block diagram of a computing device in which aspects of the illustrative embodiments may be implemented.

Thus, the illustrative embodiments may be utilized in many different types of data processing environments. In order to provide a context for the description of the specific elements and functionality of the illustrative embodiments, FIG. 1 is provided hereafter as example environments in which aspects of the illustrative embodiments may be implemented. It should be appreciated that FIG. 1 is only an example and is not intended to assert or imply any limitation with regard to the environments in which aspects or embodiments of the present invention may be implemented. Many modifications to the depicted environments may be made without departing from the spirit and scope of the present invention.

FIG. 1 is a block diagram of an example data processing system in which aspects of the illustrative embodiments may be implemented. Data processing system 100 is an example of a computer, such as client 110 in FIG. 1, in which computer usable code or instructions implementing the processes for illustrative embodiments of the present invention may be located.

In the depicted example, data processing system 100 employs a hub architecture including north bridge and memory controller hub (NB/MCH) 102 and south bridge and input/output (I/O) controller hub (SB/ICH) 104. Processing unit 106, main memory 108, and graphics processor 110 are connected to NB/MCH 102. Graphics processor 110 may be connected to NB/MCH 102 through an accelerated graphics port (AGP).

In the depicted example, local area network (LAN) adapter 112 connects to SB/ICH 104. Audio adapter 116, keyboard and mouse adapter 120, modem 122, read only memory (ROM) 124, hard disk drive (HDD) 126, CD-ROM drive 130, universal serial bus (USB) ports and other communication ports 132, and PCI/PCIe devices 134 connect to SB/ICH 104 through bus 138 and bus 140. PCI/PCIe devices may include, for example, Ethernet adapters, add-in cards, and PC cards for notebook computers. PCI uses a card bus controller, while PCIe does not. ROM 124 may be, for example, a flash basic input/output system (BIOS).

HDD 126 and CD-ROM drive 130 connect to SB/ICH 104 through bus 140. HDD 126 and CD-ROM drive 130 may use, for example, an integrated drive electronics (IDE) or serial advanced technology attachment (SATA) interface. Super I/O (SIO) device 136 may be connected to SB/ICH 104.

An operating system runs on processing unit 106. The operating system coordinates and provides control of various components within the data processing system 100 in FIG. 1. As a client, the operating system may be a commercially available operating system such as Microsoft® Windows 7®. An object-oriented programming system, such as the Java™ programming system, may run in conjunction with the operating system and provides calls to the operating system from Java™ programs or applications executing on data processing system 100.

As a server, data processing system 100 may be, for example, an IBM® eServer™ System P® computer system, running the Advanced Interactive Executive (AIX®) operating system or the LINUX® operating system. Data processing system 100 may be a symmetric multiprocessor (SMP) system including a plurality of processors in processing unit 106. Alternatively, a single processor system may be employed.

Instructions for the operating system, the object-oriented programming system, and applications or programs are located on storage devices, such as HDD 126, and may be loaded into main memory 108 for execution by processing unit 106. The processes for illustrative embodiments of the present invention may be performed by processing unit 106 using computer usable program code, which may be located in a memory such as, for example, main memory 108, ROM 124, or in one or more peripheral devices 126 and 130, for example.

A bus system, such as bus 138 or bus 140 as shown in FIG. 1, may be comprised of one or more buses. Of course, the bus system may be implemented using any type of communication fabric or architecture that provides for a transfer of data between different components or devices attached to the fabric or architecture. A communication unit, such as modem 122 or network adapter 112 of FIG. 1, may include one or more devices used to transmit and receive data. A memory may be, for example, main memory 108, ROM 124, or a cache such as found in NB/MCH 102 in FIG. 1.

Those of ordinary skill in the art will appreciate that the hardware in FIG. 1 may vary depending on the implementation. Other internal hardware or peripheral devices, such as flash memory, equivalent non-volatile memory, or optical disk drives and the like, may be used in addition to or in place of the hardware depicted in FIG. 1. Also, the processes of the illustrative embodiments may be applied to a multiprocessor data processing system, other than the SMP system mentioned previously, without departing from the spirit and scope of the present invention.

Moreover, the data processing system 100 may take the form of any of a number of different data processing systems including client computing devices, server computing devices, a tablet computer, laptop computer, telephone or other communication device, a personal digital assistant (PDA), or the like. In some illustrative examples, data processing system 100 may be a portable computing device that is configured with flash memory to provide non-volatile memory for storing operating system files and/or user-generated data, for example. Essentially, data processing system 100 may be any known or later developed data processing system without architectural limitation.

With the mechanisms of the illustrative embodiments, a client computing device may provide an integrated circuit device model to a server computing device. Alternatively, the client computing device may communicate with the server computing device to design an integrated circuit device model. In either case, the server computing device may provide software/hardware mechanisms for performing simulation and testing of the integrated circuit device model in accordance with the illustrative embodiments described hereafter. In particular, the testing performed by the mechanisms of the server computing device may involve controlling the sequence of states used to apply a test pattern.

It should be appreciated that with such an embodiment, the testing performed is via simulation of the integrated circuit device based on selected test pattern inputs to the simulation. The mechanisms of the illustrative embodiments may simulate the operation of the integrated circuit device as well as the on-chip voltage response to various current draws of various cycles of operation of the integrated circuit device. Thus, the integrated circuit device model provided by the client computing device may include a logic model, a power or on-chip voltage model, and the like.

By way of the operation of the mechanisms of the illustrative embodiments, in one implementation, in order to identify the failed component, such as a latch, the mechanisms execute LBIST patterns on a properly working integrated circuit device. After each test loop, the mechanisms scan and store all latch values of the properly working integrated circuit device into a first results file. The mechanisms then execute identical LBIST patterns on an untested integrated circuit device. Again, after each loop, the mechanisms scan and store all latch values of the current integrated circuit device into a second results file. The mechanisms identify a failing latch of the current integrated circuit device when values obtained from the properly working integrated circuit device and values obtained from current integrated circuit device are compared at the end of the entire sequence of test loops and the results do not match.

Figure 2A:
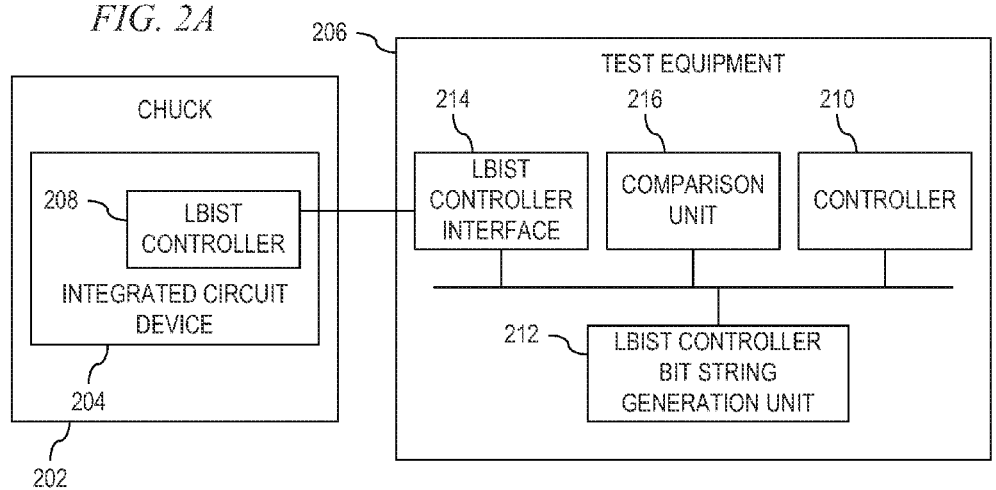
FIG. 2A is an exemplary block diagram of the primary operational components used for LBIST testing in accordance with an illustrative embodiment.

FIG. 2A is an exemplary block diagram of the primary operational components used for LBIST testing in accordance with an illustrative embodiment. As shown in FIG. 2A, the exemplary testing mechanism comprises temperature controlled chuck 202 upon which integrated circuit device 204 may be provided and test equipment 206 for interfacing with LBIST controller 208 that controls the application of testing patterns to the logic of integrated circuit device 204.

Test equipment 206 comprises controller 210, LBIST controller bit string generation unit 212, LBIST controller interface 214, and comparison unit 216. Controller 210 controls the overall operation of the test equipment 206 and orchestrates the operation of the other elements 212-216. LBIST controller bit string generation unit 212 generates a configuration bit string for controlling the operation of LBIST controller 208 of integrated circuit device 204. The configuration bit string specifies that the LBIST run using a particular state sequence selected from a number of predefined sequences, as described hereafter, the cycle count and waveform for test control signals within each state, and other parameters that are not pertinent to the specific mechanisms of the illustrative embodiments.

LBIST controller bit string generation unit 212 provides the generated configuration bit string to the LBIST controller 208 via LBIST controller interface 214. LBIST controller 208 obtains a result of the application of a test pattern by LBIST controller 208 from integrated circuit device 204. LBIST controller interface 214 receives these results from LBIST controller 208 and provides the results to comparison unit 216 of test equipment 206 for comparison to known good results in order to verify proper operation of the logic of integrated circuit device 204.

Figure 2B:
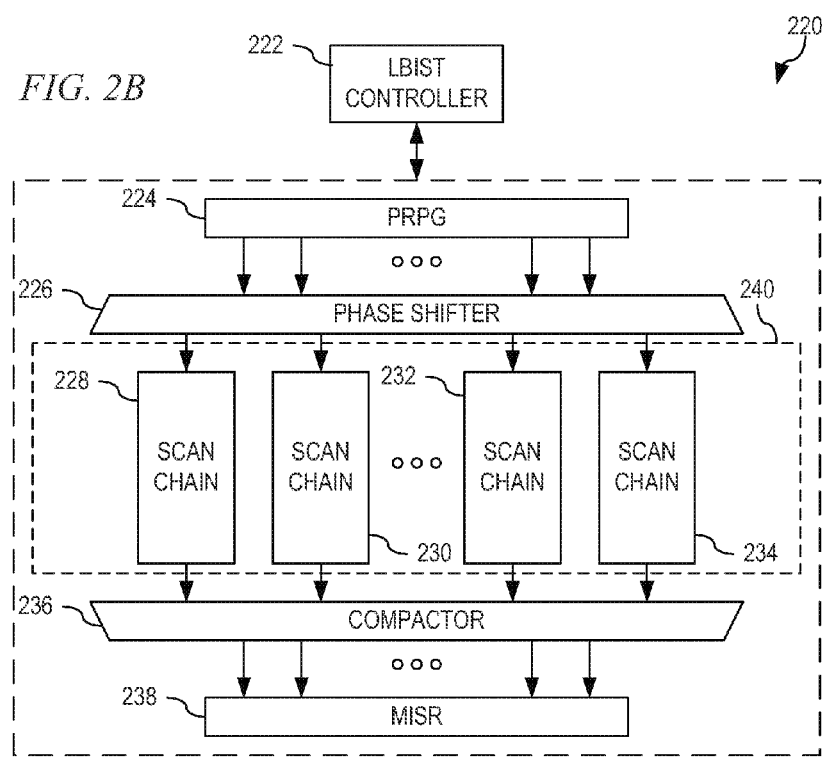
FIG. 2B is an exemplary block diagram of LBIST logic of an integrated circuit device for performing LBIST testing in accordance with an illustrative embodiment.

FIG. 2B is an exemplary block diagram of LBIST logic of an integrated circuit device for performing LBIST testing in accordance with an illustrative embodiment. As depicted in FIG. 2B, LBIST logic 220 comprises LBIST controller 222, Pseudo-Random Pattern Generator (PRPG) 224, phase shifter 226, set of scan chains 228-234, compacter 236, and multiple input signature register (MISR) 238. These LBIST components are integrated within an integrated circuit device, which the LBIST components are designed to test.

LBIST controller 222 includes control circuitry that controls the operation of the remainder of the LBIST components. For purposes of clarity, LBIST controller 222 is depicted as being coupled to the LBIST components as a group, although LBIST controller 222 is typically coupled directly to each of the components. One of the functions of LBIST controller 222 is to provide a seed value to PRPG 224. Based upon this seed value, PRPG 224 generates a pseudorandom sequence of bits that are processed by phase shifter 226 and loaded into scan chains 228-234. LBIST controller 222 controls the manner by which this pseudorandom sequence of bits are loaded into the scan chains 228-234 by way of a sequence of cycle states determined based on the configuration bit string provided as an input to LBIST controller 222, as described hereafter.

The purpose of the pseudorandom sequence of bits generated by PRPG 224 is to provide a set of input bits to be propagated through the functional logic components of logic circuit 240. The pseudorandom sequence is therefore provided to each of the scan chains 228-234. It should be noted, however, that the pseudorandom bit sequence is loaded into scan chains 228-234 only after being processed by phase shifter 226.

Phase shifter 226 makes the character of the bit sequence loaded into the scan chains 228-234 more random. That is, the phase shifter 226 shifts the phase of the pseudorandom sequence of bits so that an identifiable pattern within succeeding bit sequences of different scan chains is not present. Essentially, phase shifter 226 operates by shifting the phase of each succeeding column with respect to the preceding column. In other words, rather than being offset by a single bit in each succeeding column, the bit patterns in succeeding columns are shifted by different amounts. This improved randomization of the pseudorandom bit sequence which is loaded into scan chains 228-234 can improve the fault coverage and effectiveness of the LBIST testing. While not essential to the test architecture, phase shifter 226 therefore improves the operation of the test circuitry.

The pseudorandom bit patterns that are generated by PRPG 224 and phase shifter 226 are loaded into scan chains 228-234. Each of scan chains 228-234 comprises a series of scan latches that are configured to alternately shift data (the pseudorandom bit patterns or functional logic output) through the scan chains or to hold data that has been propagated through the functional logic.

As indicated above, a separate sequence is loaded into each of scan chains 228-234. Each of scan chains 228-234 is positioned before or after (interposed with) respective portions of logic circuit 240. Thus, for each portion of logic circuit 240, there is a scan chain which precedes this portion and provides inputs to the corresponding logic, as well as a scan chain which follows this portion and receives the output of the corresponding logic. The scan chains thereby define "levels" of the logic circuit (portions of the logic circuit between successive scan chains). For example, one level of logic circuit 240 may receive input bits from scan chain 228 and provide output bits to scan chain 230. Similarly, another level of logic circuit 240 may receive input bits from scan chain 232 and provide output bits to scan chain 234. It should be noted that some of scan chains 228-234 may serve both to provide input bits to a succeeding level of logic circuit 240 and to receive output bits from a preceding level of logic circuit 240.

After the pseudorandom bit patterns have been allowed to propagate through the components of logic circuit 240 and the results have been captured in scan chains 228-234, the contents of scan chains 228-234 are scanned out of the scan chains (i.e., they are unloaded from the scan chains) to compactor 236 and MISR 238. The purpose of compactor 236 is simply to reduce the number of bits that have to be handled by MISR 238. Compactor 236 may be implemented in a number of ways. Typically, compactor 236 employs a series of XOR gates, where the output of each XOR gate is based upon inputs received from a pair of scan chains. The number of bits that are then passed to MISR 238 may therefore be reduced by a factor of 2. In alternative environments, more complex circuitry may allow the number of bits to be reduced by an even greater factor. After the bits from scan chains 228-234 have been compacted by compactor 236, they are provided to MISR 238 and the results from MISR 238 are provided to LBIST controller 222.

It should be noted that, while only four scan chains 228-234 and one MISR 238 are depicted in the FIG. 2B, there may be many scan chains in a set of scan chains in the LBIST design feeding MISR 238 and many sets of scan chains, each feeding a different MISR. If more scan chains are included in the design, more fine-grained testing of the logic circuit can be performed. In other words, if there are more scan chains in the design, fewer of the components of logic circuit 240 are positioned between successive scan chains.

Returning to FIG. 2A, upon receiving the results, LBIST controller interface 214 provides the results to comparison unit 216 for comparison to known good results in order to verify proper operation of the logic of integrated circuit device 204. However, integrated circuit device 204 operates at a frequency that is in the multiple GigaHertz. In order for test equipment 206 to determine whether the LBIST test passed or failed, all the MISR information has to be scanned out at the end of the test at test frequencies. Since test equipment 206 operates at a much slower frequency that the integrated circuit device, i.e. (hundreds of MegaHertz vs GigaHertz), test equipment 206 only determines whether the LBIST test passed or failed and, if there is a failure, which MISR that failed the test. That is, currently there is no way to determine which latch coupled to the failing MISR failed.

Figure 3:
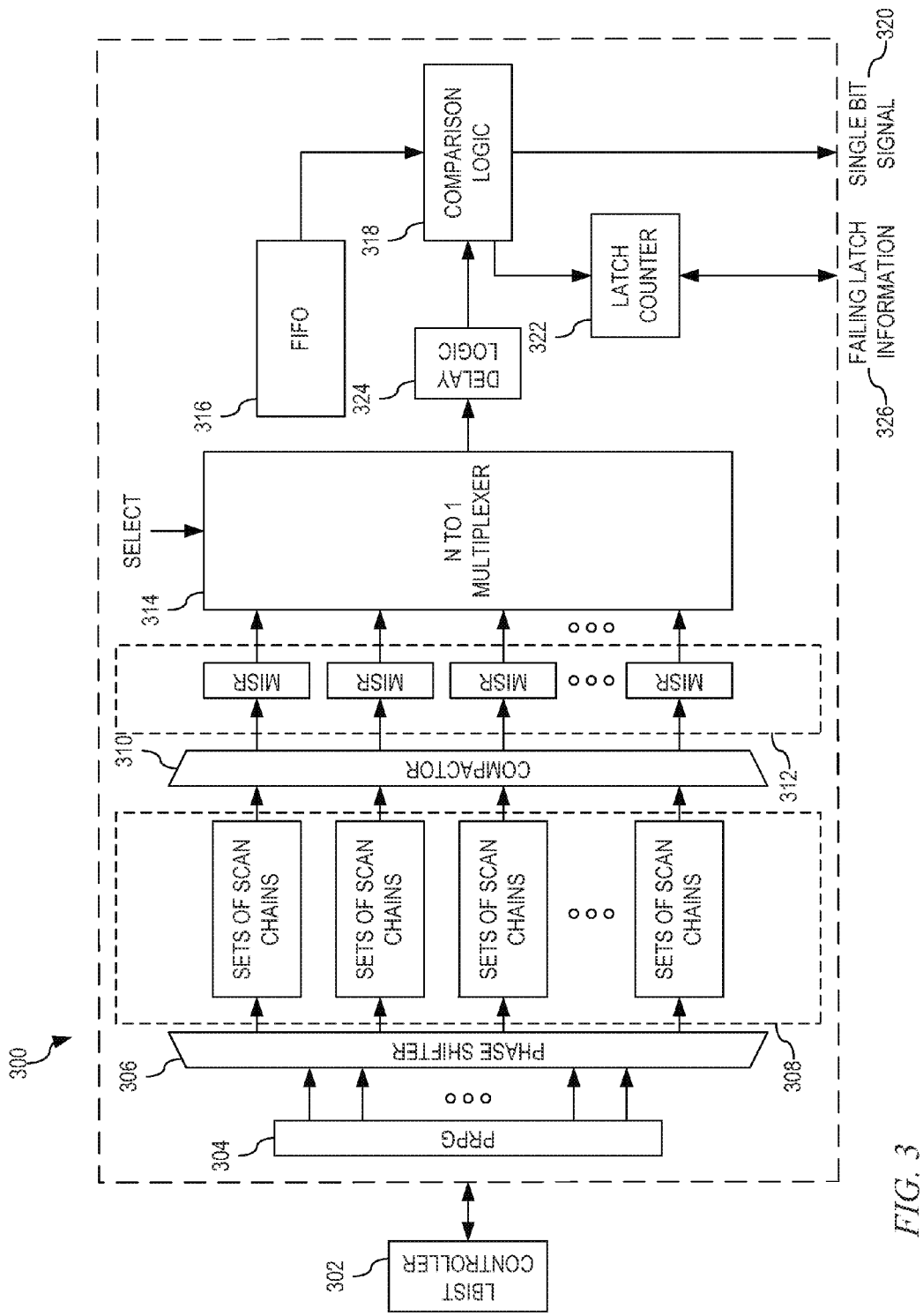
FIG. 3 depicts an exemplary block diagram of enhanced LBIST logic configuration of an integrated circuit device in accordance with an illustrative embodiment.

FIG. 3 depicts an exemplary block diagram of enhanced LBIST logic configuration of an integrated circuit device in accordance with an illustrative embodiment. LBIST logic 300 comprises LBIST controller 302, Pseudo-Random Pattern Generator (PRPG) 304, phase shifter 306, sets of scan chains 308, compacter 310, and sets of multiple input signature registers (MISRs) 312. These LBIST components are integrated within an integrated circuit device, which the LBIST components are designed to test. Each of LBIST controller 302, Pseudo-Random Pattern Generator (PRPG) 304, phase shifter 306, sets of scan chains 308, compacter 310, and sets of multiple input signature registers (MISRs) 312 operate in the same manner as LBIST controller 322, Pseudo-Random Pattern Generator (PRPG) 224, phase shifter 226, set of scan chains 228-234, compacter 236, and multiple input signature register (MISR) 238 of FIG. 2B.

In contradistinction to the operation performed by LBIST logic 220 and test equipment 206 that only identifies a failing MISR, LBIST logic 300 provides additional information as to which latch in conjunction with the failing MISR is faulty. In order to provide this failing latch information, LBIST logic 300 further comprises N-to-1 multiplexer 314, first in, first out (FIFO) data structure 316, comparison logic 318, latch counter 322, and delay logic 324.

To assist with finding the failing latch, all outputs of MISRs 312 are coupled to N-to-1 multiplexer 314. N-to-1 multiplexer 314 is utilized to select one of the n MISRs 312, were n is the total number of MISRs 312 in the integrated circuit device. This selection process enables LBIST logic 300 to focus only on the failing logic associated with the failing MISR. FIFO data structure 316 comprises a number of expected MISR signatures that would occur when there are no defects in the design of the integrated circuit device. These expected MISR signatures may be gathered from a simulation of LBIST running on the integrated circuit, from actual hardware, i.e. golden signatures, or the like. The width of FIFO data structure 316 matches the width of MISRs 312. The depth of FIFO data structure 316 is designed specific such that the depth may be m, where m is any positive integer.

Comparison logic 318 utilizes a real-time output of the failing MISR and compares those bits to the expected values that are stored in FIFO data structure 316. Comparison logic 318 outputs single bit signal 320 that identifies pass or fail. Comparison logic 318 may be routed to an external pin of the integrated circuit device in order to inform external test equipment that a fail has been detected. Latch counter 322 operates in conjunction with comparison logic 318 and FIFO data structure 316. MISR counter increments each time comparison logic 318 compares a real-time output of the failing MISR to the expected values that are stored in FIFO data structure 316. When comparison logic 318 detects a miscompare between the real-time output of the failing MISR and the expected values that are stored in FIFO data structure 316, latch counter 322 stops the count. Latch counter 322 further comprises a coupling to an external pin of the integrated circuit device in order for failing latch information 326 to be read out. Delay logic 324 pipelining in the MISR path so as to ensure that the signals always arrive at a pre-determined time when comparison logic 318 is ready to compare the real-time output of the failing MISR to the expected values that are stored in FIFO data structure 316.

As an example, of the operation performed by LBIST logic 300, once test equipment, such as test equipment 206 identifies a failing one of MISRs 312 and a LBIST sequence associated with the failure, the controller in the test equipment initiates another test. However, this test is limited only to the failing MISR in order to identify a failing latch within the failing MISR. Upon initiation of this modified test by the controller of the test equipment, known good expected values, retrieved from the test equipment, for the failing MISR are loaded into FIFO data structure 316. Latch counter 322 is initialized concurrent with the FIFO data structure. For this embodiment, initialization of the LBIST controller 302, FIFO data structure 316, and latch counter 322 are achieved by scanning the LBIST logic 300. Once the expected values for the failing MISR are loaded into FIFO data structure 316 and latch counter 322 is initialized, LBIST controller 302 reruns the failing LBIST sequence. In a first embodiment, comparison logic 318 then compares the real-time output of the failing MISR to the expected values that are stored in FIFO data structure 316, incrementing latch counter 322 each time the comparison passes. Once comparison logic 318 identifies a failed comparison, comparison logic 318 may stop latch counter 322 and activate single bit signal 320 to indicate a fail. In this embodiment, identification of the failing latch may be determined by using the value in latch counter 322 as the offset into the scan chain. However, since latch counter 322 was only incremented based on comparison passes, then the value in latch counter 322 utilized as the offset into the scan chain is the offset plus 1. For example, if the scan chain is 1024 bits long and the counter value is 867, then latch 868 is the defective latch. In an alternative embodiment, comparison logic 318 compares the real-time output of the failing MISR and to the expected values that are stored in FIFO data structure 316, incrementing latch counter 322 each time the comparison passes. However, in this alternative embodiment, once comparison logic 318 identifies a failed comparison, comparison logic 318 may increment latch counter 322 one last time, stop latch counter 322, and activate the single bit signal 320 to indicate a fail. In this embodiment, identification of the failing latch using the actual value in latch counter 322 as the offset into the scan chain. For example, if the scan chain is 1023 bits long and the counter value is 867, then latch 867 is the defective latch. LBIST controller 302 may then complete the LBIST loop normally or stop the LBIST sequence. Upon identifying the failure via single bit signal 320, the test equipment scans out the value in latch counter 322 register to identify the exact latch that failed.

The circuit as described above may be part of the design for an integrated circuit chip. The chip design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design may then be converted into the appropriate format (e.g., GDSII) for the fabrication of photolithographic masks, which typically include multiple copies of the chip design in question that are to be formed on a wafer. The photolithographic masks may be utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case the chip may be mounted in a single chip package (such as a plastic carrier, with leads that are affixed to a motherboard or other higher level carrier) or in a multichip package (such as a ceramic carrier that has either or both surface interconnections or buried interconnections). In any case, the chip may then be integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor. Moreover, the end products in which the integrated circuit chips may be provided may include game machines, game consoles, hand-held computing devices, personal digital assistants, communication devices, such as wireless telephones and the like, laptop computing devices, desktop computing devices, server computing devices, or any other computing device.

Figure 4:
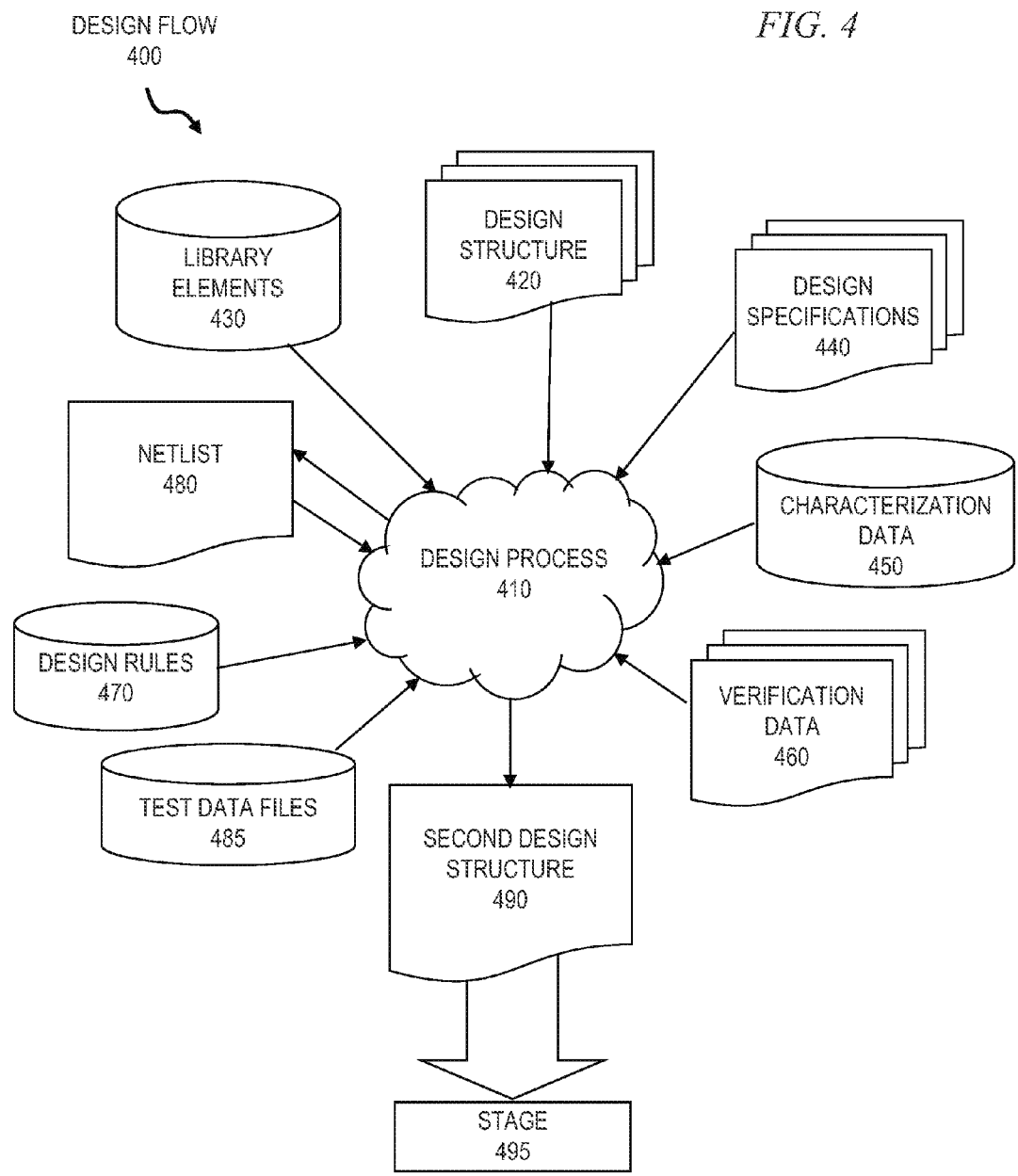
FIG. 4 shows a block diagram of an exemplary design flow used, for example, in semiconductor IC logic design, simulation, test, layout, and manufacture.

FIG. 4 shows a block diagram of an exemplary design flow 400 used, for example, in semiconductor IC logic design, simulation, test, layout, and manufacture. Design flow 400 includes processes and mechanisms for processing design structures to generate logically or otherwise functionally equivalent representations of the embodiments of the invention shown in FIGS. 2A, 2B, and 3. The design structures processed and/or generated by design flow 400 may be encoded on machine-readable transmission or storage media to include data and/or instructions that when executed or otherwise processed on a data processing system generate a logically, structurally, or otherwise functionally equivalent representation of hardware components, circuits, devices, or systems.

FIG. 4 illustrates multiple such design structures including an input design structure 420 that is preferably processed by a design process 410. Design structure 420 may be a logical simulation design structure generated and processed by design process 410 to produce a logically equivalent functional representation of a hardware device. Design structure 420 may also or alternatively comprise data and/or program instructions that when processed by design process 410, generate a functional representation of the physical structure of a hardware device. Whether representing functional and/or structural design features, design structure 420 may be generated using electronic computer-aided design (ECAD) such as implemented by a core developer/designer. When encoded on a machine-readable data transmission or storage medium, design structure 420 may be accessed and processed by one or more hardware and/or software modules within design process 410 to simulate or otherwise functionally represent an electronic component, circuit, electronic or logic module, apparatus, device, or system such as those shown in FIGS. 2-3. As such, design structure 420 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 410 preferably employs and incorporates hardware and/or software modules for synthesizing, translating, or otherwise processing a design/simulation functional equivalent of the components, circuits, devices, or logic structures shown in FIGS. 2-3 to generate a netlist 480 which may contain design structures such as design structure 420. Netlist 480 may comprise, for example, compiled or otherwise processed data structures representing a list of wires, discrete components, logic gates, control circuits, I/O devices, models, etc. that describes the connections to other elements and circuits in an integrated circuit design. Netlist 480 may be synthesized using an iterative process in which netlist 480 is resynthesized one or more times depending on design specifications and parameters for the device. As with other design structure types described herein, netlist 480 may be recorded on a machine-readable data storage medium. The medium may be a non-volatile storage medium such as a magnetic or optical disk drive, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 410 may include hardware and software modules for processing a variety of input data structure types including netlist 480. Such data structure types may reside, for example, within library elements 430 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 440, characterization data 450, verification data 460, design rules 470, and test data files 485 which may include input test patterns, output test results, and other testing information. Design process 410 may further include modules for performing standard circuit design processes such as timing analysis, verification, design rule checking, place and route operations, etc.

Design process 410 employs and incorporates well-known logic and physical design tools such as HDL compilers and simulation model build tools to process design structure 420 together with some or all of the depicted supporting data structures to generate a second design structure 490. Similar to design structure 420, design structure 490 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 2-3. In one embodiment, design structure 490 may comprise a compiled, executable HDL simulation model that functionally simulates the devices shown in FIGS. 2-3.

Design structure 490 may also employ a data format used for the exchange of layout data of integrated circuits and/or symbolic data format (e.g. information stored in a GDSII (GDS2), GL1, OASIS, map files, or any other suitable format for storing such design data structures). Design structure 490 may comprise information such as, for example, symbolic data, map files, test data files, design content files, manufacturing data, layout parameters, wires, levels of metal, vias, shapes, data for routing through the manufacturing line, and any other data processed by semiconductor manufacturing tools to fabricate embodiments of the invention as shown in FIGS. 2-3. Design structure 490 may then proceed to a stage 495 where, for example, design structure 490 proceeds to tape-out, is released to manufacturing, is released to a mask house, is sent to another design house, is sent back to the customer, etc.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method, in an integrated circuit device, for identifying a failing latch within the integrated circuit device, comprising:
   loading a set of expected values for a set of scan chains associated with a multiple input signature register into a data structure;
   initializing a counter to an initial value;
   initiating a test sequence on the set of scan chains associated with the multiple input signature register, wherein the test sequence comprises a set of test portions; and
   for each of the set of test portions:
      comparing an output of the multiple input signature register to a corresponding value in the set of expected values;
      responsive to determining a match between the output of the multiple input signature register to the corresponding value in the set of expected values, incrementing the counter; and
      responsive to determining that the output of the multiple input signature register does not match the corresponding value in the set of expected values:
         stopping the increment of the counter, and
         reading out the value of the counter to identify the failing latch in the integrated circuit device.

2. The method of claim 1, wherein identification of the failing latch is achieved by identifying a latch that follows the value read out of the counter.

3. The method of claim 1, further comprising:
   responsive to the negative match between the output of the multiple input signature register to the corresponding value in the set of expected values:
      prior to stopping the increment of the counter, incrementing the counter;
      after incrementing the counter, stopping any further increment of the counter; and
      reading out the value of the counter to identify the failing latch in the integrated circuit device.

4. The method of claim 3, wherein identification of the failing latch is achieved by identifying a latch that matches the value read out of the counter.

5. The method of claim 1, wherein the data structure is a first in, first out data structure.

6. The method of claim 1, wherein the method is performed by logic built-in self-test logic integrated into the integrated circuit device.

7. The method of claim 1, further comprising:
   signaling a failure of the test sequence, wherein signaling the failure of the test sequence is identified through a single bit.

8. The method of claim 1, further comprising:
   signaling a failure of the test sequence, wherein signaling the failure of the test sequence cancels testing of remaining portions of the test sequence.

9. An integrated circuit device comprising a logic built-in self-test device for identifying a failing latch within the integrated circuit device, wherein the logic built-in self-test device:
   receives a set of expected values for a set of scan chains associated with a multiple input signature register into a data structure;
   initiates a test sequence on the set of scan chains associated with the multiple input signature register, wherein the test sequence comprises a set of test portions; and
   for each of the set of test portions:
      compares an output of the multiple input signature register to a corresponding value in the set of expected values;
      responsive to determining a match between the output of the multiple input signature register to the corresponding value in the set of expected values, increments a counter, wherein the counter has been initialized to an initial value prior to incrementing the counter a first time; and
      responsive to determining that the output of the multiple input signature register does not match the corresponding value in the set of expected values:
         stops the increment of the counter; and
         read out the value of the counter to identify the failing latch in the integrated circuit.

10. The integrated circuit device of claim 9, wherein identification of the failing latch is achieved by identifying a latch that follows the value read out of the counter.

11. The integrated circuit device of claim 9, wherein the logic built-in self-test device further:
   responsive to the negative match between the output of the multiple input signature register to the corresponding value in the set of expected values:
      prior to stopping the increment of the counter, increments the counter;
      after incrementing the counter stops any further increment of the counter; and
      reads out the value of the counter to identify the failing latch in the integrated circuit device.

12. The integrated circuit device of claim 11, wherein identification of the failing latch is achieved by identifying a latch that matches the value read out of the counter.

13. The integrated circuit device of claim 9, wherein the data structure is a first in, first out data structure.

14. The integrated circuit device of claim 9, wherein the logic built-in self-test device:
   signals a failure of the test sequence, wherein signaling the failure of the test sequence is identified through a single bit.

15. A data processing system comprising an integrated circuit device that further comprises a logic built-in self-test device for identifying a failing latch within the integrated circuit device, wherein the logic built-in self-test device:
   receives a set of expected values for a set of scan chains associated with a multiple input signature register into a data structure;
   initiates a test sequence on the set of scan chains associated with the multiple input signature register, wherein the test sequence comprises a set of test portions; and
   for each of the set of test portions:
      compares an output of the multiple input signature register to a corresponding value in the set of expected values;
      responsive to determining a match between the output of the multiple input signature register to the corresponding value in the set of expected values, increments a counter, wherein the counter has been initialized to an initial value prior to incrementing the counter a first time; and responsive to a determining that the output of the multiple input signature register does not match the corresponding value in the set of expected values:
stops the increment of the counter, and
read out the value of the counter to identify the failing latch in the integrated circuit.

16. The data processing system of claim 15, wherein identification of the failing latch is achieved by identifying a latch that follows the value read out of the counter.

17. The data processing system of claim 15, wherein the logic built-in self-test device further:
responsive to the negative match between the output of the multiple input signature register to the corresponding value in the set of expected values:
prior to stopping the increment of the counter, increments the counter;
after incrementing the counter, stops any further increment of the counter, and
reads out the value of the counter to identify the failing latch in the integrated circuit device.

18. The data processing system of claim 17, wherein identification of the failing latch is achieved by identifying a latch that matches the value read out of the counter.

19. The data processing system of claim 15, wherein the data structure is a first in, first out data structure.

20. The data processing system of claim 15, wherein the logic built-in self-test device:
signals a failure of the test sequence, wherein signaling failure of the test sequence is identified through a single bit.

* * * * *